United States Patent
An et al.

(10) Patent No.: US 6,489,790 B1
(45) Date of Patent: Dec. 3, 2002

(54) SOCKET INCLUDING PRESSURE CONDUCTIVE RUBBER AND MESH FOR TESTING OF BALL GRID ARRAY PACKAGE

(75) Inventors: Young-soo An, Chungcheongnam-do (KR); Jae-Il Lee, Chungcheongnam-do (KR); Hyo-geun Chae, Chungcheongnam-do (KR); Jeong-ho Bang, Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/519,720

(22) Filed: Mar. 7, 2000

(30) Foreign Application Priority Data

Mar. 8, 1999 (KR) .............................. 99-7500
Dec. 18, 1999 (KR) ........................... 99-58928

(51) Int. Cl.[7] .............................. G01R 31/02
(52) U.S. Cl. ...................... 324/755; 324/758; 324/765
(58) Field of Search ................. 324/754, 755, 324/761, 758, 765, 715, 757, 760, 538; 438/15, 14, 18; 439/68; 29/843, 852

(56) References Cited

U.S. PATENT DOCUMENTS

| 4,138,369 | A |   | 2/1979 | Arai et al. ............... 252/512 |
| 4,302,361 | A |   | 11/1981 | Kotani et al. ........... 252/503 |
| 5,545,050 | A |   | 8/1996 | Sato et al. ............... 439/331 |
| 5,831,441 | A | * | 11/1998 | Motooka |
| 5,955,888 | A | * | 9/1999 | Frederickson |
| 6,084,421 | A | * | 7/2000 | Swart |
| 6,204,680 | B1 | * | 3/2001 | Swart |
| 6,208,156 | B1 | * | 3/2001 | Hembree |

* cited by examiner

Primary Examiner—Michael Sherry
Assistant Examiner—Trung Nguyen
(74) Attorney, Agent, or Firm—Skjerven Morrill LLP (57) ABSTRACT

A socket for testing a BGA package capable of avoiding problems like deformation of external terminals of the BGA package or failing to detect a defective BGA package and a test method using the socket are provided. The socket for testing a BGA package connects solder balls (or solder bumps) as external terminals of the BGA package via a mesh, a pressure conductive rubber (PCR) as a middle connection unit, and a channel connection means of a socket board. A plane board having POGO pins or a printed circuit pattern can be used for the channel connection means.

20 Claims, 6 Drawing Sheets

SOCKET INCLUDING PRESSURE CONDUCTIVE RUBBER AND MESH FOR TESTING OF BALL GRID ARRAY PACKAGE

BACKGROUND OF THE INVENTION

1. Field of the Invention

The present invention relates to a packaging for integrated circuits, and more particularly, to a socket for testing a ball grid array (hereinafter referred to as BGA) package and-a test method using the socket.

2. Description of the Related Art

After fabrication of semiconductor devices, an electrical die sorting (EDS) test determines which of the devices are good. The good devices are packaged and electrically tested further. In the testing, the packaged devices are placed in sockets corresponding to their package forms. Plastic packages having outer leads have been widely used in the industry. However, many packages such as ball grid array packages, fine-pitch ball grid array packages, and chip scale packages have solder balls or solder bumps as external terminals.

Sockets for the testing have various methods of construction and shapes according to the outer forms of packages. That is, in the case where the packages have a dual in-line package (DIP) form, a small out-line package (SOP) form, a quad flat package (QFP) form, or a BGA package form, the shape and construction of the sockets are each different.

As the size of electrical devices have become small these days, the packages using solder balls or solder bumps have replaced packages using leads.

Typical sockets for testing the BGA package having solder balls or solder bumps include POGO pins that contact the solder balls or the solder bumps. Such sockets are disclosed in U.S. Pat. No. 5,545,050, which is herein incorporated as reference in its entirety.

The POGO pins can cause several problems in testing the BGA package.

First, when the tips of the POGO pins being used for a channel connection means are connected to the solder balls or the solder bumps, the POGO pins may scratch and damage the solder balls or the solder bumps, producing visual defects such as burrs.

Second, since the POGO pins are constructed to have a pin type in number "1" shape, the POGO pins connect solder ball/bump pads to a socket board, even if the solder balls or the solder bumps are not attached to a package body of semiconductor devices due to mistakes in assembling. Accordingly, a defective BGA package in which the solder balls or the solder bumps are not attached cannot be detected.

SUMMARY OF THE INVENTION

To solve the above problems, it is a first object of the present invention to provide an apparatus for testing a BGA package capable of connecting solder balls as the external terminals of the BGA package to a tester by using a pressure conductive rubber (hereinafter referred to as a PCR) and a mesh and thereby preventing damage to the solder balls and accurately detecting a defective BGA package in which the solder balls are not attached.

It is a second object of the present invention to provide a method for electrically testing the BGA package.

To achieve the first object of the present invention, there is provided an apparatus for testing a BGA package. The apparatus includes: a socket board having a channel connection means; a middle connection unit composed of a PCR attached to the socket board; a mesh having holes in which solder balls are inserted and being attached to the middle connection unit; and a frame unit attached to the edges of the middle connection unit and the mesh, for fixing and aligning the middle connection unit and the mesh, including an alignment means.

According to an embodiment of the present invention, the socket board is a plane having a plurality of POGO pins as the channel connection means.

According to another embodiment of the present invention, the socket board is a plane having a printed circuit pattern as the channel connection means.

According to still another embodiment of the present invention, the BGA package is a strip-type package including a unit package or several packages attached to one strip.

It is preferable to further include a contactor, which applies pressure to the BGA package so that the external terminals of the BGA package contact the middle connection unit via the mesh.

Preferably, the PCR of the middle connection unit contains conductive particles including nickel (Ni) and gold (Au), and the conductive particles are vertically arranged in a silicon rubber, and the frame unit includes a supporting board of the middle connection unit, a height-adjusting means, and an alignment means for aligning the middle connection unit and the height-adjusting means.

To achieve the second object of the present invention, there is provided a method for electrically testing a BGA package, comprising the steps of: loading the BGA package on a pressure conductive rubber; aligning the solder balls of the BGA package in holes of the mesh of the socket; connecting the solder balls to conductive particles of a PCR via the mesh by applying pressure to the upper part of the BGA package; connecting the conductive particles of the PCR to a channel connection means of a socket board; and connecting the channel connection means to channels of a tester.

According to preferred embodiments of the present invention, a plane having the POGO pins or a plane having the printed circuit pattern can be used for the channel connection means. The BGA package may be constructed of a unit package or several packages. Preferably, the mesh forms several holes in which the solder balls of the BGA package are inserted.

According to the present invention, damage or variation occurring in the external terminals can be prevented by using the middle connection unit and the mesh as a means for connecting the socket board to the solder balls as the external terminals of the BGA package. Also, errors in an open/short test can be reduced by smoothly connecting the external terminals and the socket board to each other. Thus, a defective BGA package in which the solder balls are not attached can be accurately detected in a final electrical test.

BRIEF DESCRIPTION OF THE DRAWINGS

The features and advantages of the present invention will become more apparent by describing in detail preferred embodiments of the invention with reference to the attached drawings in which.

Use of the same reference numerals in different figures indicate identical or similar items.

DESCRIPTION OF THE PREFERRED EMBODIMENTS

Embodiment 1: Socket for electrically testing a BGA package in the case where a plane board having POGO pins as a channel connection means of a socket board is used.

Figure 1:
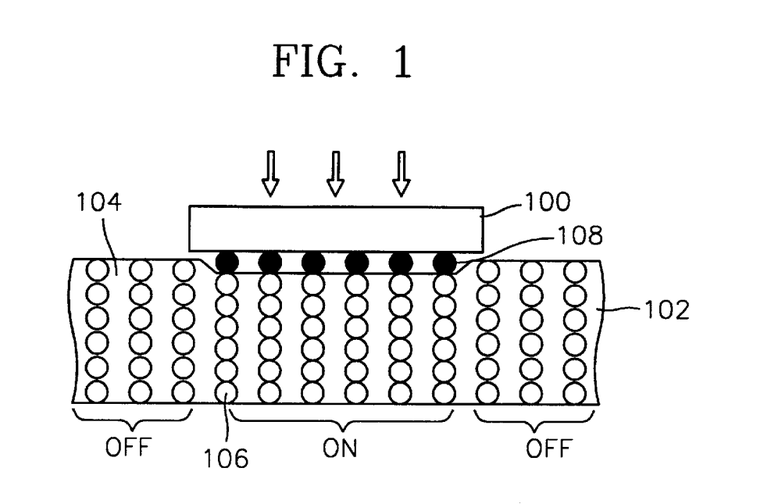
FIG. 1 is a sectional view of a pressure conductive rubber (PCR) in contact With a BGA package.

FIG. 1 is a sectional view of a pressure conductive rubber (PCR) in contact with a BGA package.

Referring to FIG. 1, in the structure of a pressure conductive rubber (PCR) 102 having conductivity caused by external-pressure, conductive particles 106 are arranged between an insulating rubber 104 with a predetermined pitch. Thus, the insulating rubber 104 has no conductivity in the state in which external pressure is not applied. However, the insulating rubber 104 is compressed when a predetermined external pressure is applied, and thus a stroke occurs and the conductive particles 106 which are vertically arranged come into contact each other such that they are electrically connected in the vertical direction.

Thus, when a BGA package in which solder balls 108 are used as an external connection means is pressed from above, the solder balls 108 of a BGA package body 100 apply external pressure pressing the PCR 102, and thus electrical connection (ON) of the vertical direction can be realized. Also, a region without pressure is electrically insulated (OFF).

The PCR 102 having conductivity caused by external pressure as a means for connecting the solder balls to a socket board has effects as follows. That is, the solder balls are not damaged and thus have no visual defects. Also, in the case where the solder balls 108 are missing (i.e., not attached to the BGA package body 100 due to defects in assembling), the PCR 102 is not pressed and thus it is not contacted. Accordingly, a defective BGA package in which one or more of the solder balls are not attached may be accurately detected in a final electrical test.

Since the insulating rubber 104 is made of silicon rubber, the insulating rubber 104 has a thermal expansion coefficient similar to that of the semiconductor wafer. The smaller difference in thermal expansion coefficient of the insulating rubber 104 and the BGA package body 100 is less likely to cause miscontact between the conductive particles 106 in the insulating rubber 104 and the BGA package body 100 when temperature changes during electrical testing. Further, the PCR 102 is not materially degraded when used between −40° C. and +150° C. Also, since the chief ingredients of the conductive particles 106 are nickel (Ni) and gold (Au), the conductive particles 106 have excellent conductivity. Furthermore, in the case where the PCR 102 is used instead of conventional POGO pins, the life span of the PCR 102, having 50,000 or more cycles, is increased.

Figure 2:
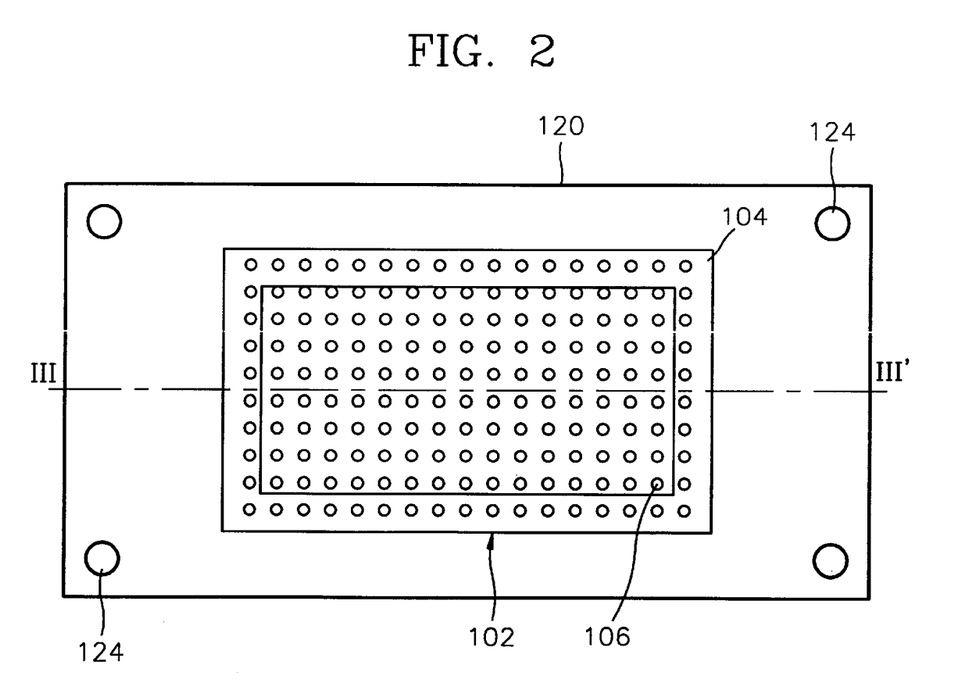
FIG. 2 is a plan view of PCRs of a middle connection unit attached to a supporting board of the middle connection unit of a frame unit.

FIG. 2 is a plan view of PCRs of a middle connection unit attached to a supporting board of the middle connection unit of a frame unit.

Referring to FIG. 2, the PCR 102 as a middle connection unit for connecting a socket board and a BGA package is conceptually explained in the FIG. 1, but in the plan view, the PCR 102 will be more concretely described. Explaining in detail, a PCR 102A (FIG. 3) for fixing is first attached to a supporting board 120 of the middle connection unit. The supporting board 120 is composed of metal or plastics and punched in the middle portion and has a plane shape. Another PCR 102B (FIG. 3), being acted by external pressure, is attached to the PCR 102A and fixed. At this time, the conductive particles 106 in the PCRs 102A and 102B may be attached in an arranged state so as to be connected to each other. Also, alignment holes 124 for an alignment means are at four corners of the supporting board 120 of the middle connection unit. Accordingly, when the supporting board 120 of the middle connection unit is assembled in the socket board, a channel connection means on the socket board, for example, POGO pins or a printed circuit pattern, is fitted to the conductive particles 106 of the supporting board 120 such that they come into electrical contact. This is possible by inserting a screw 122 of FIG. 6 as an alignment means into each of the alignment holes 124 of the supporting board 120 of the middle connection unit and by fixing the screw. Accordingly, the screws 122 removably attach the supporting board 120 of the middle connection unit to the socket board. Thus, a worn out middle connection unit containing the PCR is easily replaced.

Figure 3:
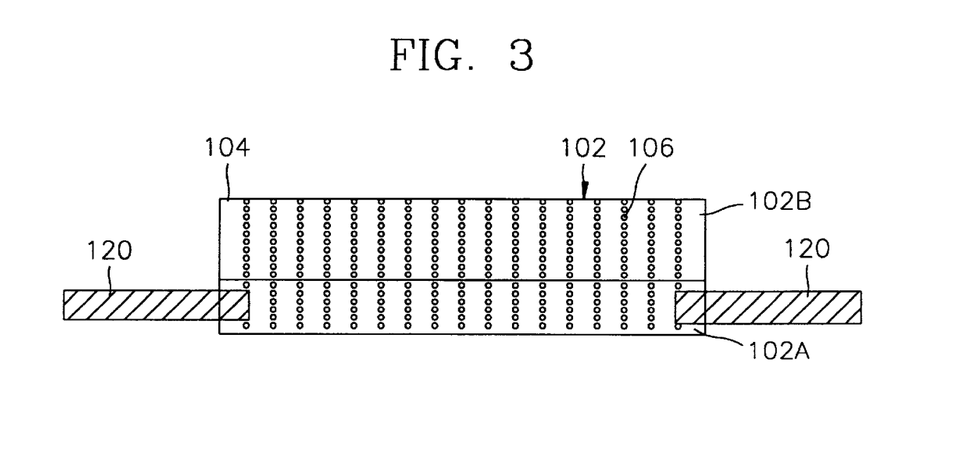
FIG. 3 is a sectional view taken along line III–III' of FIG. 2.

FIG. 3 is a sectional view taken along line III–III' of FIG. 2.

Referring to FIG. 3, the PCR 102A for fixing is first attached to the supporting board 120 of the middle connection unit, and the PCR 102B being acted by external pressure is attached to the PCR 102A. At this time, the conductive particles 106 of the PCRs 102A and 102B are arranged to provide conductivity when external pressure is applied.

Figure 4:
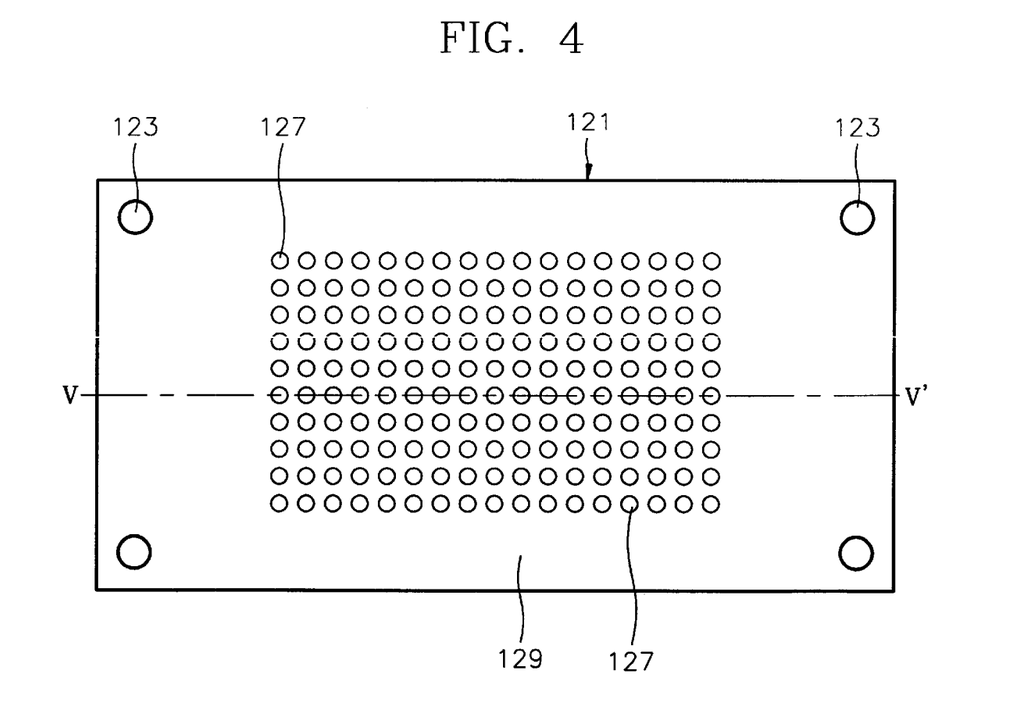
FIG. 4 is a plan view of a mesh attached to the middle connection unit.

FIG. 4 is a plan view of a mesh attached to the middle connection unit.

Referring to FIG. 4, a mesh 121 is attached to the middle connection unit including PCR 102 of FIG. 2. The mesh 121 determines the sitting location of solder balls as an external terminal of the BGA package and prevents variation of solder balls when the BGA package is electrically tested at a high temperature for a long time. The mesh 121 has four alignment holes 123, in which screws 122 (FIG. 6) composed of an insulating material such as plastic are inserted for aligning in a main body 129, and many holes 127 in which solder balls of the BGA package sit. The holes 127 are constructed at the same interval as that of the conductive particles 106 of the PCR 102 shown in FIG. 2. The mesh 121 is an important means for electrically testing the BGA package together with the middle connection unit.

Figure 5:
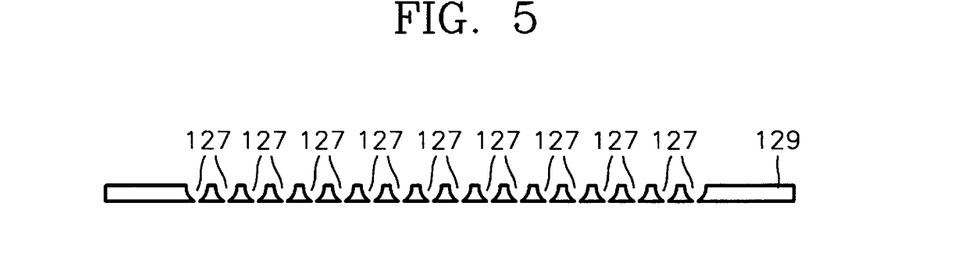
FIG. 5 is a sectional view taken along line V–V' of FIG. 4.

FIG. 5 is a sectional view taken along line V–V' of FIG. 4.

Referring to FIG. 5, solder balls of the BGA package sit in the holes 127 formed in the main body 129, and the holes 127 can be connected to the conductive particles of the PCR.

Figure 6:
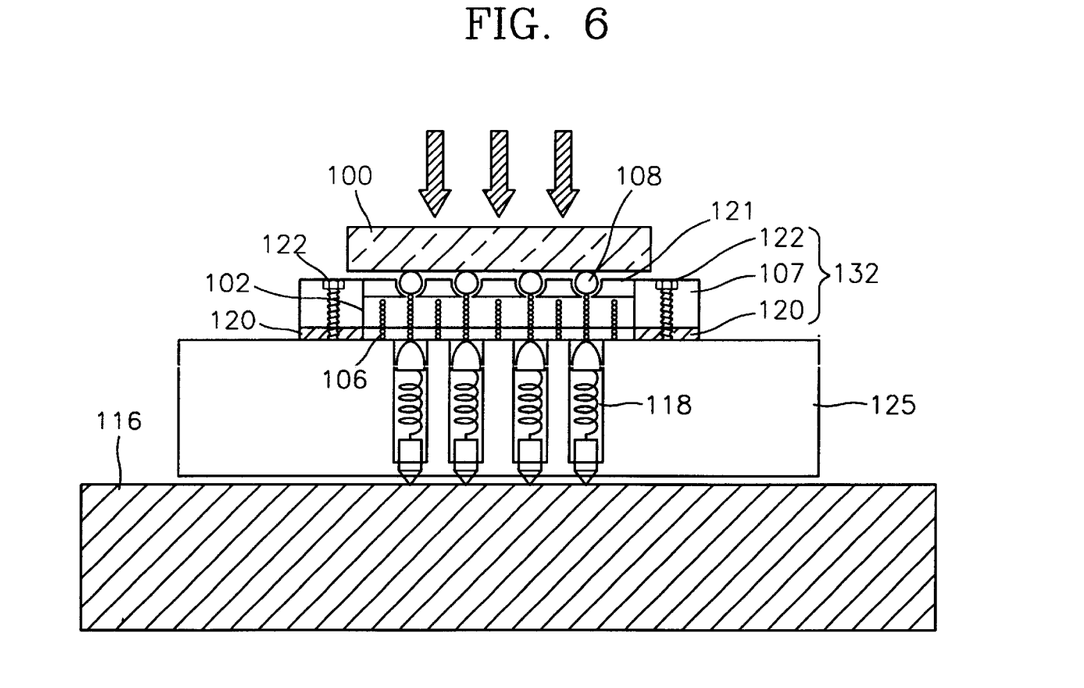
FIG. 6 is a schematic sectional view of a BGA package loaded on a socket for electrically testing according to a first embodiment of the present invention.

FIG. 6 is a schematic sectional view of a case where the BGA package is loaded on a socket for electrical testing according to a first embodiment of the present invention.

Referring to FIG. 6, the socket for electrical testing according to the first embodiment of the present invention includes: a socket board 125 having POGO pins 118 as a channel connection unit; a middle connection unit having the PCR 102 on the socket board 125; a mesh 121 having holes in which solder balls 108 are inserted, on the middle connection unit; and a frame unit 132 having an alignment means 122 for fixing and aligning on the edges of the middle connection unit 102 and the mesh 121.

Reference numeral 116 indicates a performance board of a tester and indicates a board having a channel connection terminal of the tester. Reference numeral 122 indicates an alignment means, and preferably, screws may be used as alignment means. Reference numeral 118 indicates POGO pins, and the POGO pins 118 are connected to the conductive particles 106 of the PCR 102 by elasticity of a spring in the inside the POGO pins 118.

Reference numeral 107 indicates a height-adjusting means. The structure of the height-adjusting means is same as that of the supporting board 120 of the middle connection unit shown in FIG. 2, and the height-adjusting means 107 adjusts only the thickness and thereby makes the surface of the socket for electrically testing the BGA package level. If the height-adjusting means 107 is not used, variations such as lifting of the middle connection unit can occur in the course of repeating an electrical test, and thus, the conductive particles 106 of the PCR 102 can become disconnected from the POGO pins 118 of the socket board 125.

Here, the shape of the frame unit 132 can be modified without limit. Since further modifications are possible by a person skilled in the art according to the structure of the facility used or requirements of an user, the shape of the socket for electrically testing the BGA package shown in the present invention is illustrative and not liming.

The preferable thickness, contact resistance, inductance, and capacitance of the PCR 102 of the socket for electrically testing a BGA package according to the present invention are 0.4 to 0.88 mm, 5 mΩ or less, 0.7 to 0.88 nH, and 1 pF or less, respectively. The PCR 102 provides better electrical connections than conventional POGO pins. Accordingly, when the socket for electrically testing a BGA package according to the present invention is applied to a final electrical test and a burn-in test, the occurrence of open failures due to the unstable contact between the solder balls and the socket of the BGA package or visual defects arising from damage or variation to the solder balls are remarkably reduced.

Figure 7:
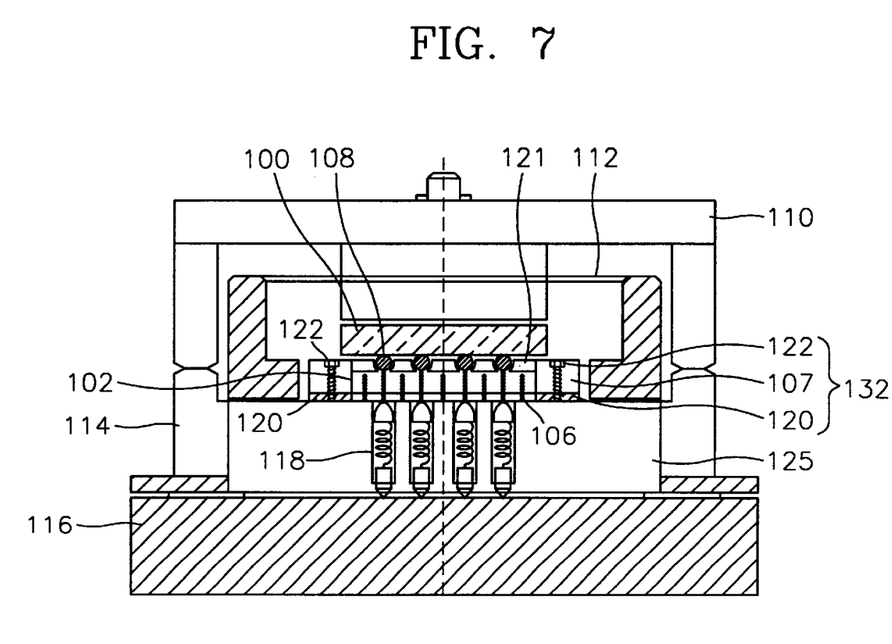
FIG. 7 is a schematic sectional view of a BGA package connected to the socket for electrically testing by a contactor according to the first embodiment of the present invention.

FIG. 7 is a schematic sectional view of a case where the BGA package is connected to the socket for electrically testing by a contactor according to the first embodiment of the present invention.

Referring to FIG. 7, a contactor includes a package pusher 110, an inserter 112 and a socket guide 114. The BGA package put into the inserter 112 by the package pusher 110 first sits on the holes in the mesh 121, for sitting solder balls. Subsequently, when external pressure, that is, contact force is applied to the package pusher 110, the solder balls 108 as an external connection unit, at the bottom side of the BGA package body 100 press the PCR 102. Accordingly, the solder balls 108 of the BGA package and the POGO pins 118 of the socket board 125 are connected to each other respectively via the PCR 102. The socket board 125 is again connected to channels of a tester via the performance board 116 and thereby an electrical test for a BGA package is performed.

Embodiment 2: Socket for electrically testing a BGA package in the case where a plane board having a printed circuit pattern as a channel connection means of a socket board is used.

In the second embodiment of the present invention, a channel connection means of the socket board is the same as that of the first embodiment of the present invention except for use of a printed circuit pattern instead of POGO pins of the first embodiment in the socket for electrically testing the BGA package. Accordingly, to avoid repetition, the above descriptions for the first embodiment are also relied on for the second embodiment, and explanations of the same or overlapping matters are omitted.

Figure 8:
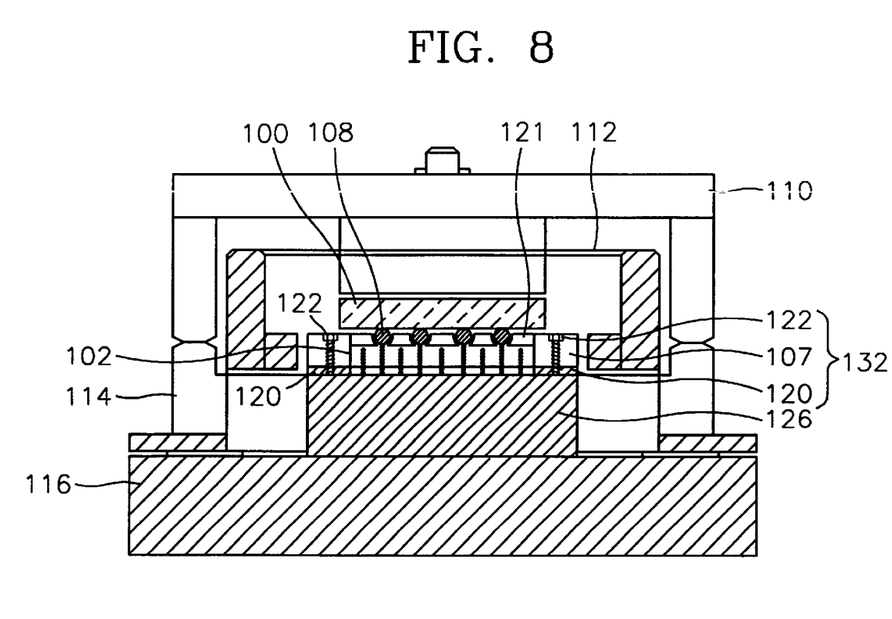
FIG. 8 is a schematic sectional view of a BGA package connected to the socket for electrically testing by the contactor according to a second embodiment of the present invention.

FIG. 8 is a schematic sectional view of a case where the BGA package is connected to the socket for electrically testing by the contactor according to the second embodiment of the present invention.

Referring to FIG. 8, the socket for electrically testing the BGA package according to the second embodiment of the present invention includes: a socket board 126 having a printed circuit pattern (see FIG. 10) as a channel connection means; a middle connection unit having the PCR 102 on the socket board 126; a mesh 121 having holes in which the solder balls 108 are inserted, on the middle connection unit; a frame unit 132 having an alignment means 122 for fixing and aligning on the edges of the middle connection unit and the mesh 121; and a contactor applying external pressure to the BGA package body 100. The frame unit 132 includes a supporting board 120 of the middle connection unit, a height-adjusting means 107, and an alignment means 122, that is, screws. The contactor includes a package pusher 110, an inserter 112, and a socket guide 114. Reference numeral 116 indicates a performance board of a tester and particularly indicates a board having a channel connection terminal of the tester.

Figure 9:
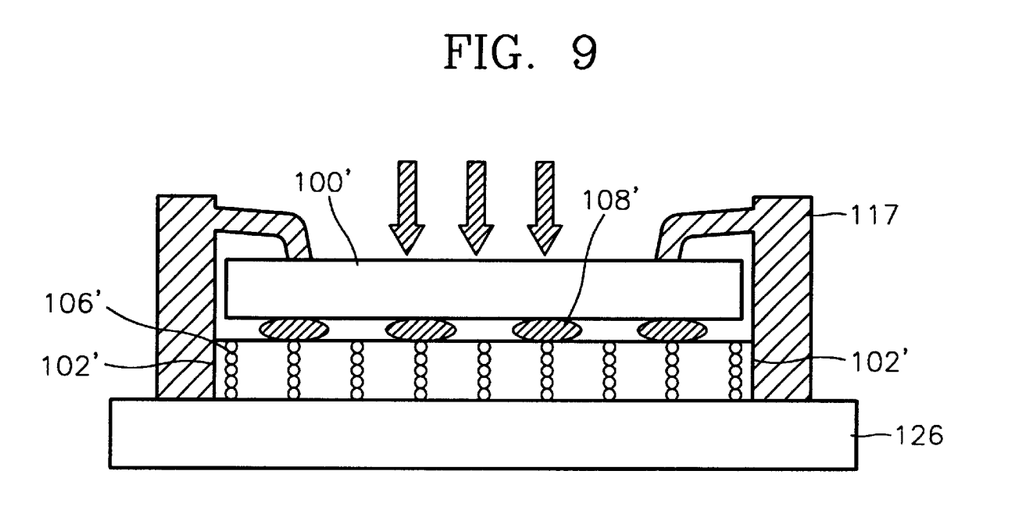
FIG. 9 is a schematic sectional view illustrating a variation of solder balls of the BGA package in the case where a mesh is not used in the present invention.

FIG. 9 is a schematic sectional view illustrating variation of solder balls of the BGA package in the case where a mesh is not used in the present invention.

Referring to FIG. 9, the socket for electrically testing the BGA package according to the present invention can be used for a reliability test having a special purpose such as a burn-in test. The burn-in process is a test process applying an electrical signal to the BGA package at a high temperature of at least 125° C. for at least an hour. As shown, if the mesh 121 is not used, external pressure (contact) applied at a high temperature for a long time flattens solder balls 108' attached to a BGA package body 100'. Accordingly, the mesh 121 added according to the present invention provides paths capable of being properly connected to conductive particles 106' of a PCR 102'. The structure of a contactor 117 has a different shape from that of contactors shown in FIGS. 7 and 8. Accordingly, various modifications of the contactor 117 are possible in accordance with the features of devices used.

Figure 10:
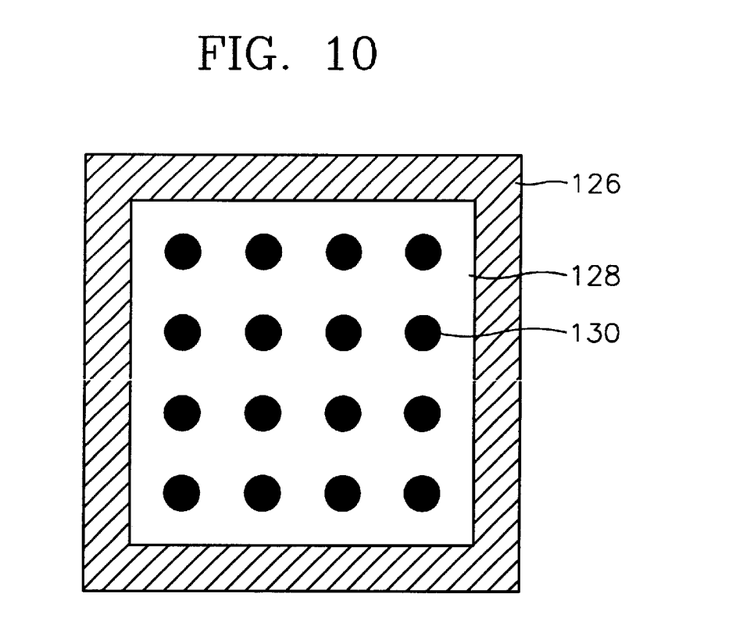
FIG. 10 is a plan view of the surface of a socket board according to the second embodiment of the present invention.

FIG. 10 is a plan view of the surface of a socket board according to the second embodiment of the present invention.

Referring to FIG. 10, the surface of a socket board 126 contacts with the conductive particles of the middle connection unit composed of the PCR such that they come into electrical contact. For this purpose, a printed circuit pattern 128 is formed as a channel connection unit, and a contact portion 130 is formed in the printed circuit pattern 128. The contact portion 130 of the printed circuit pattern 128 preferably has the same interval as those of the conductive particles of the middle connection unit and of the holes for the solder balls in the mesh. The surface of the contact portion 130 of the printed circuit pattern 128 may be gold-plated to improve the conductivity of the contact portion contacting the conductive particles.

A method for electrically testing a BGA package according to the second embodiment of the present invention is the same as that for the first embodiment of the present invention, except that the conductive particles 106 of the middle connection unit 102 are connected to the contact portion 130 of the printed circuit pattern 128 instead of the POGO pins in the socket board.

Embodiment 3: Socket for electrically testing a strip-type BGA package.

In the first and second embodiments of the present invention, the socket for a BGA package including a unit package is mainly described, but in this third embodiment, a socket for electrically testing a strip-type BGA package will be described.

Figure 11:
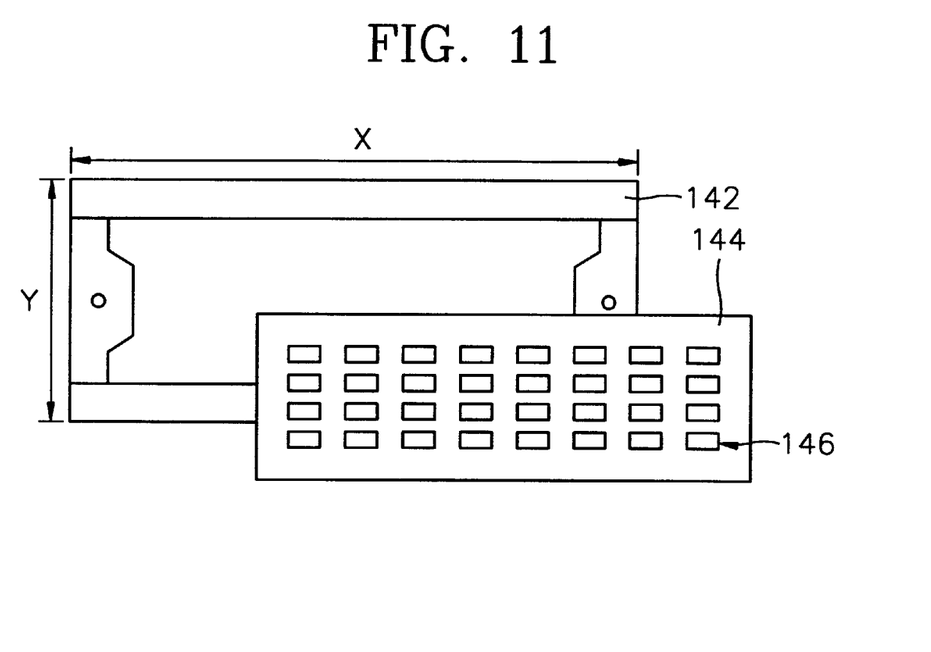
FIG. 11 is an exploded plan view illustrating several BGA packages attached to one strip and moved during steps according to the third embodiment of the present invention.

FIG. 11 is an exploded plan view illustrating several BGA packages attached to one strip and moved during steps according to the third embodiment of the present invention.

Referring to FIG. 11, BGA packages 146 before being separated by the piece are processed in a strip 144 composed of polyimide. The strip 144 performs an electrical test in the state that the strip 144 is moved into a strip carrier 142 and fixed.

Figure 12:
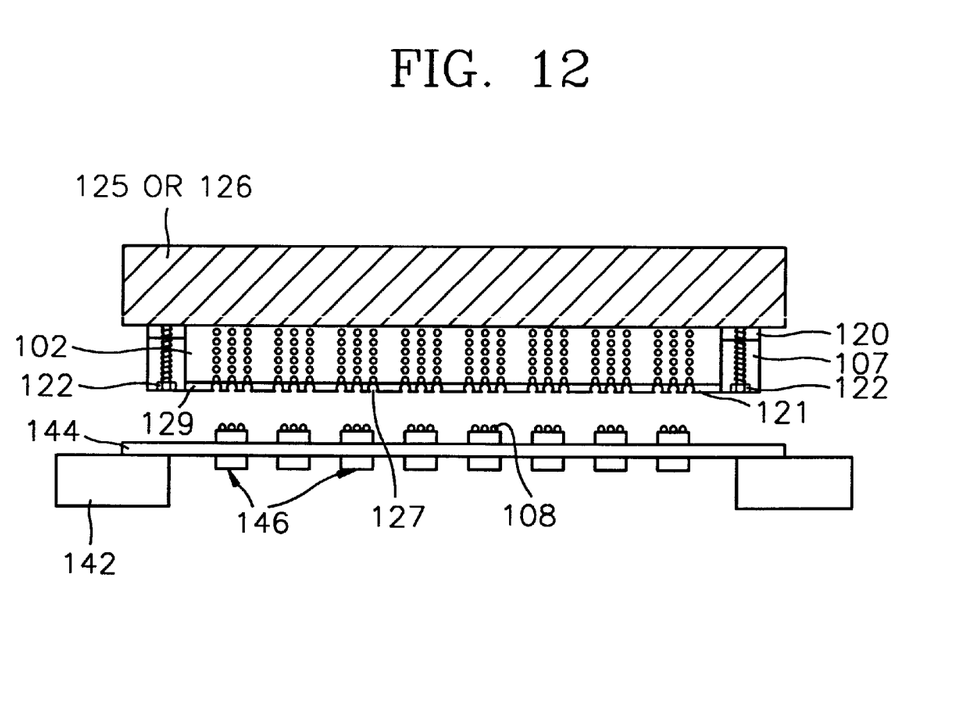
FIG. 12 is a sectional view illustrating a strip-type BGA package connected to the socket for electrically testing according to the third embodiment of the present invention.

FIG. 12 is a sectional view illustrating a strip-type BGA package connected to the socket for electrically testing according to the third embodiment of the present invention.

Referring to FIG. 12, the structure of the socket for electrically testing the strip-type BGA package is the same as those of the first and second embodiments mentioned above. It is only different in that the sizes of the middle connection unit 102 and the mesh 121 are extended so as to test several packages at one time. At this time, a channel connection means of a socket board 125 or 126 is POGO pins or a printed circuit pattern.

Thus, according to the present invention described above, first, damage or variation occurring in the external terminals can be prevented by using the middle connection unit and the mesh as a means for connecting the solder balls as the external terminals of the BGA package and the socket board. Second, errors in an open/short test can be reduced by smoothly connecting the external terminals and the socket board to each other. Third, a defective BGA package in which the solder balls are not attached can be accurately detected in a final electrical test.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. An apparatus for testing a BGA package, comprising:
    a socket board having a plurality of POGO pins as a channel connection means, the POGO pins being connected to corresponding channels of the tester;
    a middle connection unit which includes a pressure conductive rubber (PCR), the pressure conductive rubber (PCR) containing conductive particles that come into contact with each other to produce electrical conductivity in response to an external force, so that the POGO pins electrically connect to corresponding external terminals of the BGA package through the PCR; and
    a mesh composed of an insulating material, the mesh positioned between the BGA package and the middle connection unit and including a plurality holes, which are configured to receive the external terminals of the BGA package such that the external terminals are able to contact the middle connection unit through the holes.

2. The apparatus of claim 1, further comprising a contactor for applying the external force that electrically connects the external terminals of the BGA package to the POGO pins.

3. The apparatus of claim 1, wherein the conductive particles comprise nickel (Ni) or gold (Au).

4. The apparatus of claim 1, wherein the conductive particles are arranged along a direction of the external force.

5. The apparatus of claim 1, further comprising a frame that supports the middle connection unit and the mesh, the frame comprising:
    a height-adjusting unit that adjusts the height of the middle connection unit; and
    an aligning unit that aligns the middle connection unit.

6. The apparatus of claim 5, wherein the aligning unit of the frame aligns the holes of the mesh with the conductive particles of the middle connection unit so as to smoothly connect the external terminals of the BGA package to the socket board.

7. The apparatus of claim 6, wherein the aligning unit of the frame comprises a screw.

8. An apparatus for testing a BGA package, comprising:
    a socket board having a printed circuit pattern connected to a plurality of channels of a tester;
    a middle connection unit which includes a pressure conductive rubber (PCR), the pressure conductive rubber (PCR) containing conductive particles that come into contact with each other to produce electrical conductivity in response to an external force, so that the printed circuit pattern electrically connects to external terminals of the BGA package through the PCR; and
    a mesh composed of an insulating material, the mesh positioned between the BGA package and the middle connection unit and including a plurality holes, which are configured to receive the external terminals of the BGA package such that the external terminals are able to contact the middle connection unit through the holes.

9. The apparatus of claim 8, further comprising a contactor for applying the external force that electrically connects the external terminals of the BGA package to the printed circuit pattern.

10. The apparatus of claim 8, wherein the middle connection unit is capable of accommodating a plurality of BGA packages.

11. The apparatus of claim 8, wherein the conductive particles comprise nickel (Ni) or gold (Au).

12. The apparatus of claim 8, wherein the conductive particles are arranged along a direction of the external force.

13. The apparatus of claim 8, further comprising a frame which includes a screw that aligns the holes of the mesh with the middle connection unit so that the external terminals of the BGA package electrically connect to the printed circuit pattern of the socket board when the external force is applied.

14. The apparatus of claim 8, wherein the surface of the printed circuit pattern of the socket board is gold-plated.

15. The apparatus of claim 8, further comprising a frame that holds the middle connection unit between the socket board and the BGA package.

16. A method for testing a BGA package, comprising the steps of:

loading the BGA package on a pressure conductive rubber (PCR) which contains conductive particles, wherein external terminals of the BGA package sit in holes of a mesh which is between the BGA package and the PCR;

aligning a test socket board under the PCR, wherein the test socket board is connected to a tester;

applying an external force such that the external terminals of the BGA package press the PCR, wherein the conductive particles of the PCR, by the external force, contact each other along a direction of the external force, resulting in electrical connection between the external terminals of the BGA package and the test socket board; and     applying a test signal to the BGA package through the tester.

17. The method of claim 16, wherein a plurality of BGA packages are loaded on the PCR for simultaneous test.

18. The method of claim 16, wherein, when the test socket board is aligned under the PCR, a plurality of POGO pins attached on the test socket board are in contact with the PCR.

19. The method of claim 16, wherein, when the test socket board is aligned under the PCR, a printed circuit pattern of the test socket board is in contact with the PCR.

20. The method of claim 16, wherein the mesh is made of an insulating material.

\* \* \* \* \*